United States Patent
Budraa et al.

(10) Patent No.: US 7,968,426 B1
(45) Date of Patent: Jun. 28, 2011

(54) SYSTEMS AND METHODS FOR BONDING SEMICONDUCTOR SUBSTRATES TO METAL SUBSTRATES USING MICROWAVE ENERGY

(75) Inventors: Nasser K. Budraa, La Crescenta, CA (US); Boon Ng, Alhambra, CA (US)

(73) Assignee: Microwave Bonding Instruments, Inc., Arcadia, CA (US)

( * ) Notice: Subject to any disclaimer, the term of this patent is extended or adjusted under 35 U.S.C. 154(b) by 911 days.

(21) Appl. No.: 11/551,915

(22) Filed: Oct. 23, 2006

Related U.S. Application Data (60) Provisional application No. 60/730,076, filed on Oct. 24, 2005.

(51) Int. Cl.
*H01L 21/30* (2006.01)

(52) U.S. Cl. .................. 438/455; 257/E21.567

(58) Field of Classification Search .......... 438/455–457, 438/118, 119; 257/E21.567
See application file for complete search history.

(56) References Cited

U.S. PATENT DOCUMENTS

| | | | | |
|---|---|---|---|---|
| 6,054,693 | A * | 4/2000 | Barmatz et al. | 219/678 |
| 6,103,812 | A * | 8/2000 | Wei et al. | 524/496 |
| 6,284,085 | B1 * | 9/2001 | Gwo | 156/273.7 |
| 6,312,548 | B1 * | 11/2001 | Fathi et al. | 156/275.1 |
| 6,348,679 | B1 * | 2/2002 | Ryan et al. | 219/634 |
| 6,767,749 | B2 * | 7/2004 | Kub et al. | 438/3 |
| 6,905,945 | B1 * | 6/2005 | Barmatz et al. | 438/455 |
| 7,452,800 | B2 * | 11/2008 | Sosnowchik et al. | 438/615 |
| 7,487,849 | B2 * | 2/2009 | Radtke | 175/434 |
| 7,569,800 | B2 * | 8/2009 | Tian et al. | 219/665 |
| 2002/0197423 | A1 * | 12/2002 | Wang et al. | 428/34 |
| 2004/0009649 | A1 * | 1/2004 | Kub et al. | 438/459 |
| 2004/0016752 | A1 * | 1/2004 | Ratificar et al. | 219/679 |
| 2004/0024382 | A1 * | 2/2004 | Cho et al. | 604/891.1 |
| 2004/0084444 | A1 * | 5/2004 | Wang et al. | 219/679 |
| 2004/0104460 | A1 * | 6/2004 | Stark | 257/678 |
| 2004/0183182 | A1 * | 9/2004 | Swindlehurst et al. | 257/686 |
| 2005/0003263 | A1 * | 1/2005 | Mallari et al. | 429/44 |
| 2005/0178820 | A1 * | 8/2005 | Morgenstern et al. | 228/246 |
| 2005/0250232 | A1 * | 11/2005 | Joodaki | 438/31 |
| 2005/0252607 | A1 * | 11/2005 | Kirsten et al. | 156/272.4 |
| 2006/0027570 | A1 * | 2/2006 | Barmatz et al. | 219/681 |
| 2006/0038189 | A1 * | 2/2006 | Coffey et al. | 257/88 |
| 2006/0063351 | A1 * | 3/2006 | Jain | 438/455 |
| 2006/0076631 | A1 * | 4/2006 | Palmateer et al. | 257/414 |
| 2006/0093840 | A1 * | 5/2006 | Christoph et al. | 428/469 |
| 2007/0051774 | A1 * | 3/2007 | Stipp et al. | 228/101 |
| 2007/0108195 | A1 * | 5/2007 | Tian et al. | 219/702 |
| 2008/0003777 | A1 * | 1/2008 | Slater et al. | 438/455 |

OTHER PUBLICATIONS

Clendenin, Microwave Bonding of Silicon Dies with Thin Metal Films for MEMS Applications, 2003 Electronic Components and Technology Conference, pp. 18-23.*

Jerzy Ruzyllo, Semiconductor Glossary, 2004, pp. 137.*

* cited by examiner

*Primary Examiner* — Matthew C Landau
*Assistant Examiner* — Latanya Crawford (57) ABSTRACT

Systems and methods are disclosed for bonding of substrates using microwave energy. In some embodiments, semiconductor substrates can be bonded through a thin interlayer metal to a metal substrate by using microwave energy. High intensity microwave energy is applied to the substrate assembly positioned within a microwave cavity. A process of selective heating can occur in the thin interlayer metal, resulting in melting of the thin interlayer metal to facilitate bonding of the two substrates. Some of the advantages associated with such bonding process are disclosed.

7 Claims, 10 Drawing Sheets

SYSTEMS AND METHODS FOR BONDING SEMICONDUCTOR SUBSTRATES TO METAL SUBSTRATES USING MICROWAVE ENERGY

PRIORITY CLAIM

This application claims the benefit of priority under 35 U.S.C. §119(e) of U.S. Provisional Application No. 60/730,076 filed on Oct. 24, 2005 and titled SYSTEMS AND METHODS FOR BONDING SEMICONDUCTOR SUBSTRATES TO METAL SUBSTRATES USING MICROWAVE ENERGY, the entirety of which is incorporated herein by reference.

BACKGROUND

1. Field

The present disclosure generally relates to semiconductor technology, and more particularly, to systems and methods for bonding semiconductor substrates to metal substrates using microwave energy.

2. Description of the Related Art

Various devices have separate parts that are bonded together to gain more utility. For example, in many applications, different substrates may need to be bonded together to achieve higher capabilities.

In conventional techniques of bonding substrates, some conditions may lead to problems such as premature failures and reliability concerns. For example, a high bonding temperature can create excess residual stress during and/or after the bonding process. Furthermore, a high temperature condition is commonly accompanied with a high-pressure condition that can in turn weaken the bonded substrates and/or undesirably diffuse dopant materials into the substrates.

Conventional bonding can also limit the maximum bond strength when a low-melting-temperature interlayer material is used.

Conventional bonding can also result in bulk heating of one or more of the substrates. When the substrates are relatively large in size, such bulk heating can lead to difficulties in bonding due to mismatched coefficients of thermal expansion.

SUMMARY

One embodiment of the present disclosure relates to a method for bonding substrates. The method includes providing an interlayer between a first substrate and a second substrate. The method further includes providing microwave energy so that at least a portion of the microwave energy is absorbed by the interlayer to thereby raise the temperature of the interlayer. The temperature of the interlayer increases faster than that of the first and second substrates and melts to thereby facilitate bonding of the first and second substrates.

In one embodiment, the interlayer comprises a metal layer having a heat capacity less than that of the first and second substrates. In one embodiment, the metal layer comprises a thin-film metal that is initially not attached to the first or second substrate. In one embodiment, the metal layer comprises a surface coating formed on one of the first and second substrate.

In one embodiment, the first substrate comprises a metal substrate oriented so that the microwave energy impinges on the second substrate first. In one embodiment, the second substrate comprises a semiconductor substrate.

In one embodiment, the first substrate comprises a first semiconductor substrate oriented so that the microwave energy impinges on the second substrate first. In one embodiment, the second substrate comprises a second semiconductor substrate.

In one embodiment, the method further includes providing a force that facilitates parts intimacy for the first and second substrates with the interlayer therebetween. In one embodiment, the method further includes monitoring the force so as to allow detection of a melt point of the interlayer.

Another embodiment of the present disclosure relates to a system for bonding substrates. The system includes a substrate assembly comprising an interlayer between a first substrate and a second substrate. The system further includes a microwave cavity dimensioned to receive the substrate assembly so that microwave energy can be applied to the substrate assembly so that at least a portion of the microwave energy is absorbed by the interlayer to thereby raise the temperature of the interlayer. The temperature of the interlayer increases faster than that of the first and second substrates and melts to thereby facilitate bonding of the first and second substrates.

In one embodiment, the interlayer comprises a metal layer having a heat capacity less than that of the first and second substrates. In one embodiment, the metal layer comprises a thin-film metal that is initially not attached to the first or second substrate. In one embodiment, the metal layer comprises a surface coating formed on one of the first and second substrate.

In one embodiment, the first substrate comprises a metal substrate oriented so that the microwave energy impinges on the second substrate first. In one embodiment, the second substrate comprises a semiconductor substrate.

In one embodiment, the first substrate comprises a first semiconductor substrate oriented so that the microwave energy impinges on the second substrate first. In one embodiment, the second substrate comprises a second semiconductor substrate.

In one embodiment, the system further includes a pressure applicator configured to provide a force that facilitates parts intimacy for the substrate assembly. In one embodiment, the system further includes an endpoint component configured to detect a melt point of the interlayer.

In the foregoing embodiments, and other embodiments, of the present disclosure, the interlayer can be formed from metals such as AuSn, AuBe, InSn, In, AuSn, AuGe, AuNi, AuZn, and Lead-free Sn—Ag—Cu alloys, and solders. The thin-film metal can have a thickness in a range of approximately 10 to 30 microns. The surface coating interlayer can have a thickness in a range of approximately 1 to 3 microns.

In the foregoing embodiments, and other embodiments, of the present disclosure, the metal substrate can be formed from metals such as copper, molybdenum, tungsten, chrome, aluminum, platinum-titanium, and combinations such as CuMo, AlSiC. The first substrate can also be formed from non-metallic but highly microwave-absorbing materials such as certain ceramics.

In the foregoing embodiments, and other embodiments, of the present disclosure, the semiconductor substrate can be formed from silicon, sapphire, quartz, alumina, gallium-arsenide, "III-V" and "II-VI" materials.

In the foregoing embodiments, and other embodiments, of the present disclosure, the bonding can occur without a significant thermal expansion of the first and second substrates. In the embodiment where a force is applied for parts intimacy, monitoring of such a force shows that a reaction force provided by the substrate assembly is generally uniform, until the time when melting of the interlayer occurs. Such uniformity in the reaction force indicates that the substrates are not thermally expanding while the interlayer is heated and melted.

BRIEF DESCRIPTION OF THE DRAWINGS

These and other aspects, advantages, and novel features of the present teachings will become apparent upon reading the following detailed description and upon reference to the accompanying drawings. In the drawings, similar elements have similar reference numerals.

DETAILED DESCRIPTION OF SOME EMBODIMENTS

The present disclosure generally relates to systems and methods for bonding substrates using an interlayer and microwave energy. As described herein, various embodiments of the present disclosure can reduce or substantially eliminate various concerns or drawbacks associated with bonding of substrates such as semiconductor and metal. For example, likelihood of a residual stress associated with bonding of two materials can be reduced. Also, a relatively high temperature can be applied to a localized region without the use of a high pressure condition, thereby reducing the likelihood of unwanted diffusion of materials such as dopants into the substrates. Moreover, application of a relatively short-durational energy to a localized region, bulk heating of the substrates can be reduced, thereby also reducing the likelihood of undesirable conditions such as mismatched coefficients of thermal expansion.

Figure 1A:
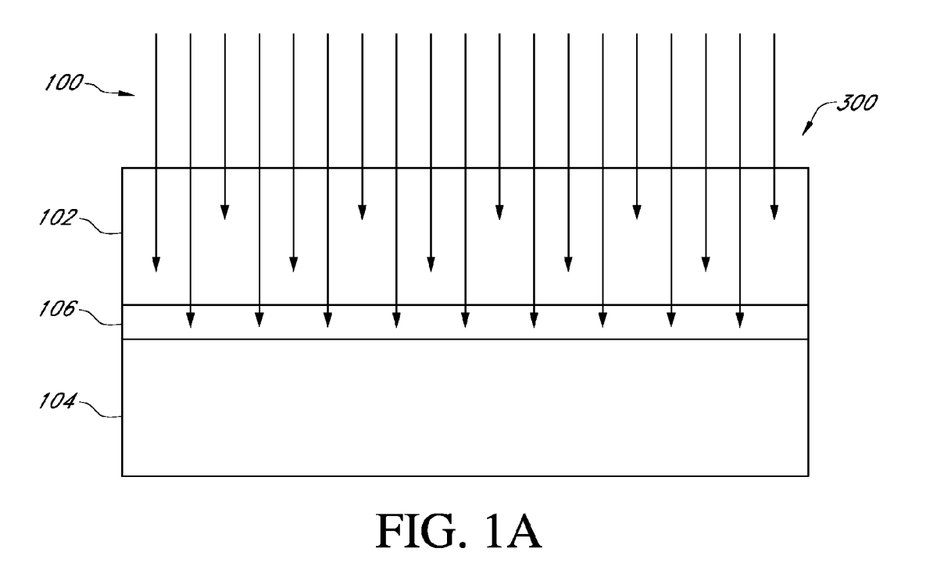
FIG. 1A shows one embodiment of a bonding situation where an interlayer is interposed between a first substrate and a second substrate, where microwave energy heats the interlayer in a localized manner.
Figure 1B:
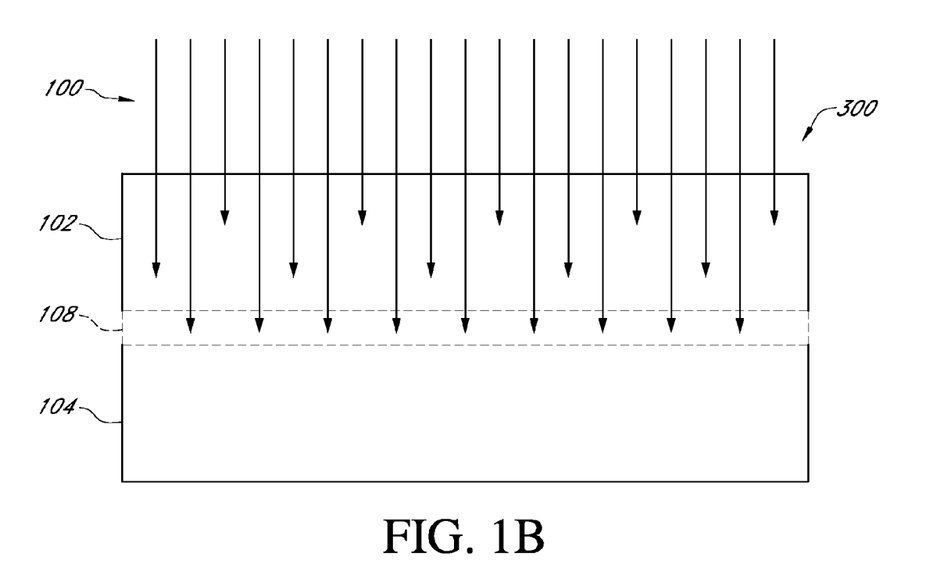
FIG. 1B shows the heated interlayer that facilitates bonding of the first and second substrates.

FIG. 1A shows one embodiment of an assembly 300 that includes a first substrate 104 being bonded with a second substrate 102 via an interlayer 106 interposed therebetween. Microwave energy 100 is shown to be applied to the assembly 300. In one embodiment, a substantial portion of the microwave energy penetrates the second substrate 102 and heats the interlayer 106. In one embodiment, the microwave energy does not penetrate the first substrate in any significant amount. With the foregoing application of the microwave energy 100, FIG. 1B shows the interlayer 108 (106 in FIG. 1A) being melted so as to bond the first and second substrates 104, 102 together.

Microwave heating transfers electromagnetic energy to heat. Microwave power is absorbed as the fields penetrate materials. The term "loss tangent" of a material represents how much of the electromagnetic field energy will be absorbed by the material. High loss tangent "lossy" materials absorb more than low-loss ones. Thus, "loss tangent" is a parameter that can describe how much microwave absorption of the material will result heating of the material. As is generally known, heating of a given material can also depend on factors such as specific heat and the mass of the given material.

In some embodiments, the first substrate 104 is formed from metal. Within metals, absorption of the microwave energy is generally limited to a "skin depth" that is very short. The skin depth is usually defined as the distance required for the power to be reduced to $1/(2.7180)$ ($1/e$, where e is the natural logarithm), of the initial value at the surface. Thus, while metals in general have relatively high loss-tangent values, the absorption is limited to their skin depth. In some metals, the skin depth can range from approximately 0.05 to approximately 5 microns. Thus, first substrates such as thick film metals do not absorb a significant amount of microwave energy.

In some embodiments, the second substrate is formed from a semiconductor. In general, the loss tangent values for semiconductors are much smaller than that of metals, and can depend on the dopant content. Typically, the loss tangent of a semiconductor increases with temperature.

In some embodiments, the interlayer is formed from metal and has a relatively small thickness. Thus, the relatively small mass (and thus small heat capacity) of the interlayer can result in a rapid rise in temperature when subjected to microwave power. In one embodiment, the thickness of the metal interlayer can be selected so that absorption can occur within or about the interlayer, but not beyond the skin depth of the metal substrate.

Thus in some embodiments, bonding of a semiconductor substrate with a metal substrate can be achieved by using a thin-film metal interlayer. Microwave energy results in significant heating within the semiconductor and within or about the skin depth of the thin metal interlayer. The skin depth of the thin metal interlayer can be less than, substantially equal to, or greater than the thickness of the same. Because the thin metal layer has a high tangent loss value than the semiconductor, and/or because the thin metal has a lower heat capacity than the semiconductor substrate, the thin metal can heat up substantially faster than the semiconductor substrate. Thus by controlling the application of the microwave energy, the thin metal can be made to melt and bond the substrates before the semiconductor substrate heats up to an undesirable level. Furthermore, because the microwave does not penetrate the metal substrate significantly beyond its skin depth, bonding can be carried without significant expansion of the metal substrate while a melting temperature is reached at the interlayer. Consequently, likelihood of mechanically induced stresses can be reduced.

As described below in greater detail, the first and second substrates may also be formed from semiconductors. In such bonding configurations, the faster heating of the interlayer can be utilized to bond the two semiconductor substrates, even though microwave energy may be deposited in either or both of the substrates.

Figure 2A:
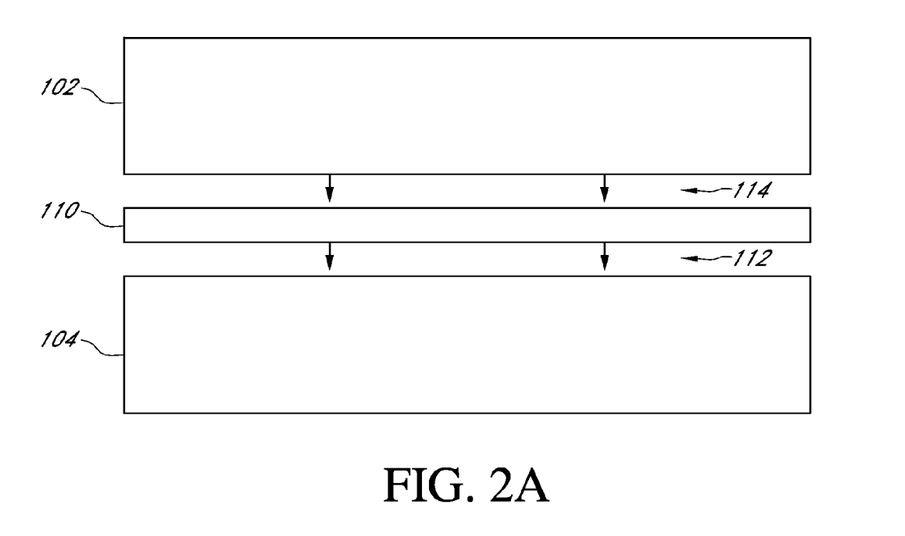
FIG. 2A shows that in one embodiment, the interlayer can be a pre-formed layer that is not fixedly attached to any of the substrates prior to application of the microwave energy.
Figure 2B:
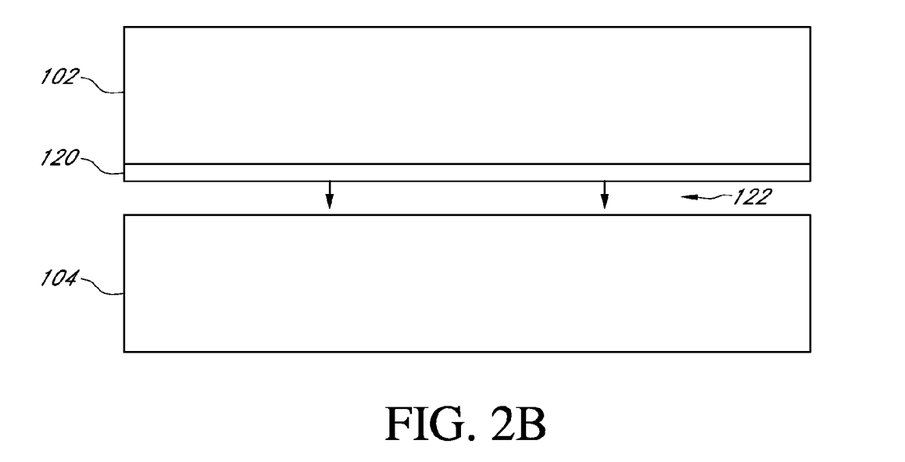
FIG. 2B shows that in one embodiment, the interlayer can be a coated layer on the surface of one or more surfaces of the substrates.
Figure 2C:
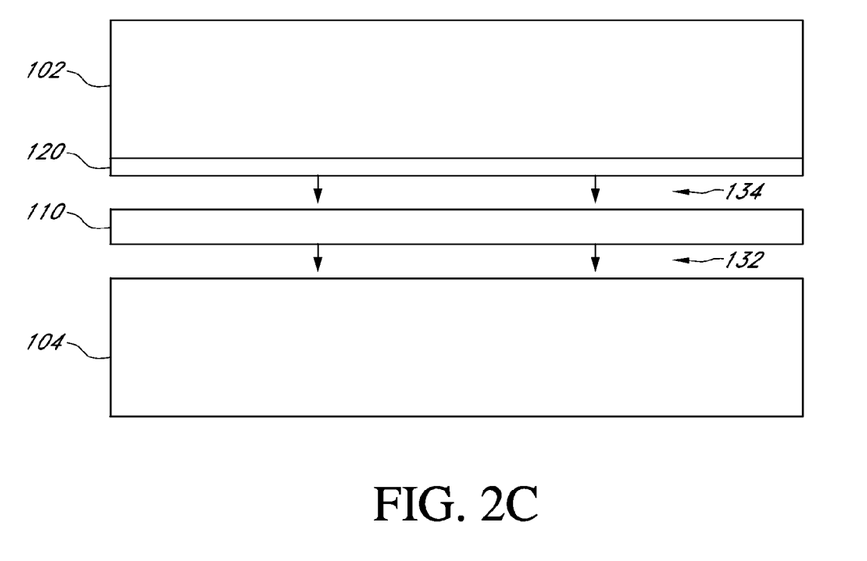
FIG. 2C shows that in one embodiment, the interlayer can be some combination of the embodiments of FIGS. 2A and 2B.

FIGS. 2A-2C show various embodiments of the interlayer that can be used to bond the various embodiments of the first and second substrates 104, 102. As shown in FIG. 2A, one embodiment of an interlayer can be a separate thin-film layer 110 that is initially not fixedly attached to the substrates 104, 102. Thus in one embodiment, the thin-film layer 110 can be positioned on the first substrate 104 (indicated by arrows 112), and the second substrate 102 can be positioned on the thin-film layer 110 (indicated by arrows 114). The resulting assembly can then be subjected to the microwave energy to bond the first and second substrates 104, 102 via melting of the thin-film layer 110.

FIG. 2B shows that in one embodiment, the interlayer can include a surface-coating 120 applied to either or both surfaces of the first and second substrates 104, 102. For example, the surface-coating 120 is depicted as being applied to the second substrate 102 prior to positioning the coated substrate (102 and 120) on the first substrate 104 (indicated by arrows 122).

FIG. 2C shows that in one embodiment, the interlayer can include some combination of the thin-film layer 110 and the surface-coating 120. For example, thin-film layer 110 is shown to be positioned on the first substrate 104 (indicated by arrows 132), and the second substrate 102 having the surface coating 120 is shown to be positioned on the thin-film layer 110 (indicated by arrows 134).

The composition and thickness of the interlayer can vary, depending on the type of application. In some embodiments, the thin-film interlayer 110 is formed from metal. In some embodiments, the surface-coating 120 is formed from metal, and can be applied to the substrate surface using known techniques. In one embodiment, a gold metal layer can be deposited on the surface of a silicon substrate using known techniques. Such surface-coating may be, for example, approximately 1 micron in thickness, and can be applied on an existing titanium diffusion barrier on the silicon substrate. The Ti diffusion barrier can prevent the formation of a Au—Si eutectic that may weaken its mechanical properties.

In some embodiments, example metals that can be used for the interlayer include, but are not limited to, AuSn, AuBe, InSn, In, AuSn, AuGe, AuNi, AuZn, and Lead-free Sn—Ag—Cu alloys, and solders.

In some embodiments, the thickness of the thin-film interlayer 110 is greater than the thickness of the surface-coating interlayer 120. In some embodiments, the thin-film interlayer 110 can have a thickness in a range of approximately 10 to 30 microns. In some embodiments, the surface-coating interlayer 120 can have a thickness in a range of approximately 1 to 3 microns.

In some embodiments the use of surface-coating 120 on a given substrate can mitigate some mechanical stress during the bonding process.

Figure 3A:
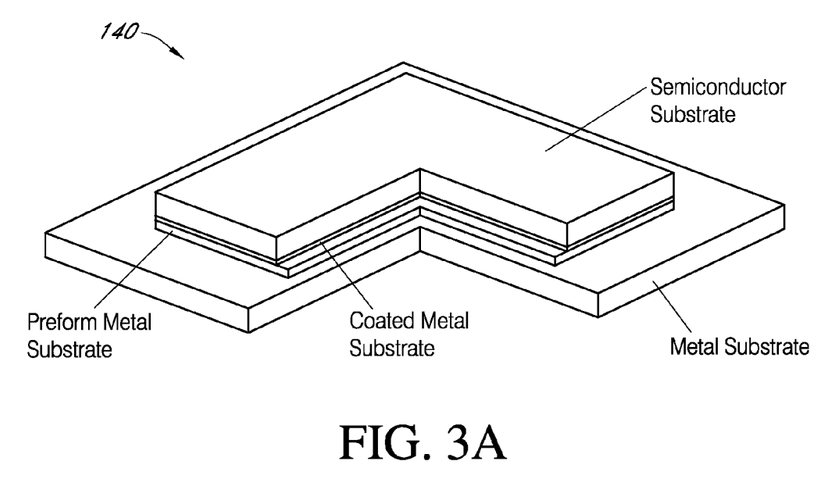
FIGS. 3A and 3B show that in one embodiment, the first substrate can be a metal substrate, the second substrate can be a semiconductor substrate, and the interlayer can be a metal.
Figure 3B:
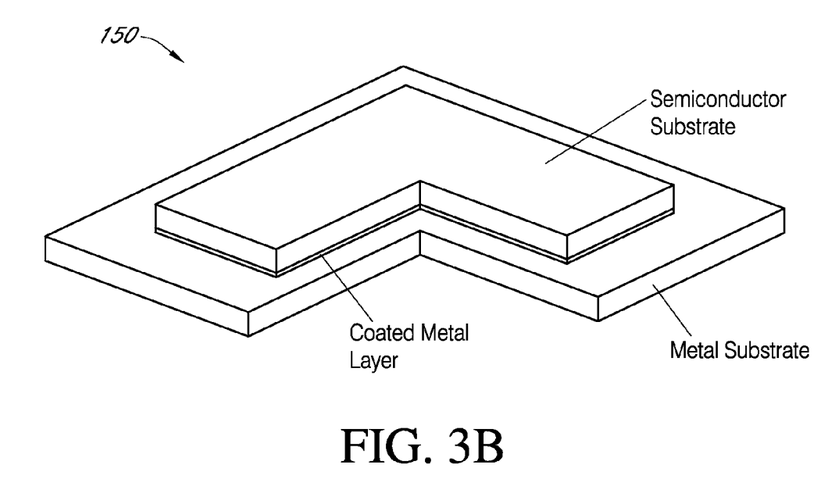

FIGS. 3A and 3B show examples of the first and second substrates being bonded via various interlayer combinations. In the example embodiments 140, 150, the first substrate is a metal, and the second substrate is a semiconductor. FIGS. 3A and 3B also shows that such a combination of substrates can be bonded by different configurations of the interlayer. For example, FIG. 3A shows that the surface-coating and the thin-film can provide the interlayer functionality. FIG. 3B shows that the surface-coating can provide the interlayer functionality. As previously described, other configurations of the interlayer may be used.

In some embodiments, metals that can be used for the first substrate include, but are not limited to, copper, molybdenum, tungsten, chrome, aluminum, platinum-titanium, and combinations such as CuMo, AlSiC. In some embodiments, the first substrate can be a non-metallic but highly microwave-absorbing material (such as certain ceramics).

In some embodiments, semiconductors that can be used for the second substrate include, but are not limited to, silicon, sapphire, quartz, alumina, gallium-arsenide, "III-V" and "II-VI" materials.

As previously described, the first substrate does not necessarily need to be a metal. In some embodiments, the first substrate can absorb the microwave energy, and still allow the bonding via the interlayer as described herein. Such bonding can be achieved at least in part because the interlayer has a relatively low heat capacity compared to the non-metallic substrate. Thus, even though microwave energy is applied to both the interlayer and the substrate, the interlayer raises the temperature of the interlayer substantially faster than that of the substrate. Thus, the interlayer can be made to melt before the substrate heats up to some undesirable level.

Figure 4:
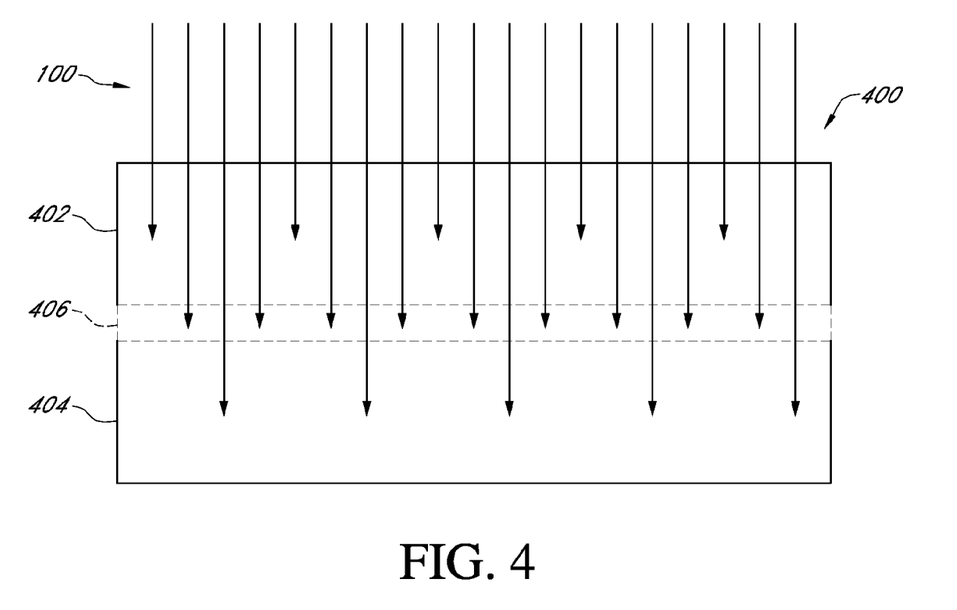
FIG. 4 shows that in one embodiment, the microwave energy can be deposited in both of the first and second substrates and the interlayer, where heating of the interlayer occurs substantially faster than that of the substrates so as to allow bonding of the substrates without detrimental heating of the substrates.

FIG. 4 shows one embodiment of a substrate assembly 400 having a first substrate 404 and a second substrate 402, with an interlayer 406 interposed therebetween. In this example, the first substrate 404 is a non-metal, and can absorb the microwave energy 100. As described above, the interlayer 406 can be heated to melting before the first substrate 404 (or the second substrate 402) is heated to an undesirable level.

Figure 5:
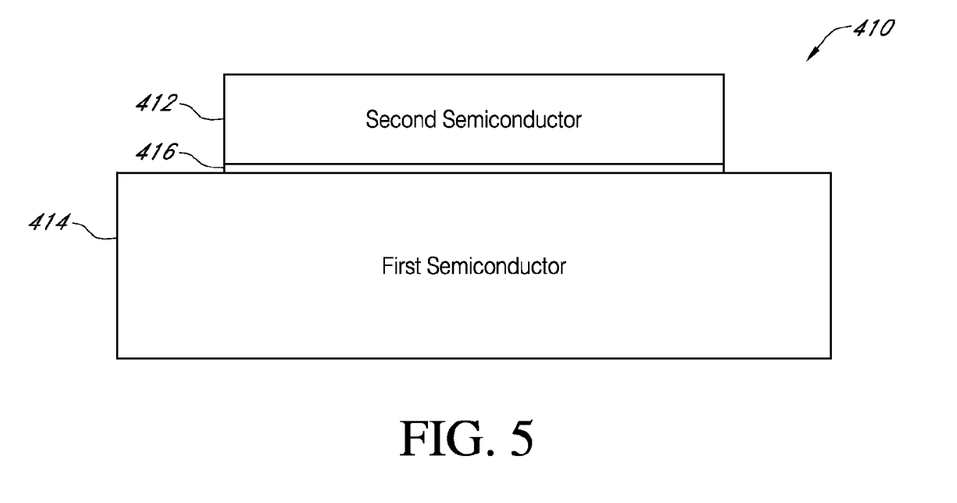
FIG. 5 shows that in one embodiment of the configuration of FIG. 4, the first substrate can be a first semiconductor, and the second substrate a second semiconductor.

FIG. 5 shows that in one embodiment 410, the first substrate can be formed from a first semiconductor 414, and the second substrate can be formed from a second semiconductor 412. An appropriate interlayer 416 is shown to be interposed between the substrates 414, 412.

In one embodiment, the first semiconductor substrate 414 can be a silicon substrate, and the second semiconductor substrate 412 a gallium-arsenide substrate. An example of an application where such a configuration can be used is an LED structure formed in the gallium-arsenide substrate, and that substrate being bonded to the silicon substrate to facilitate dissipation of heat. In one embodiment of such an LED device, the gallium-arsenide substrate containing the light emitting portion and an epilayer can have a thickness of approximately 10 to 20 microns, with the epilayer being approximately 2 microns. A metalized layer formed adjacent the epilayer can act as the interlayer 416. The resulting bonding of the relatively thin gallium-arsenide substrate to a thicker silicon substrate can provide mechanical support for the LED structure as well.

Figure 6:
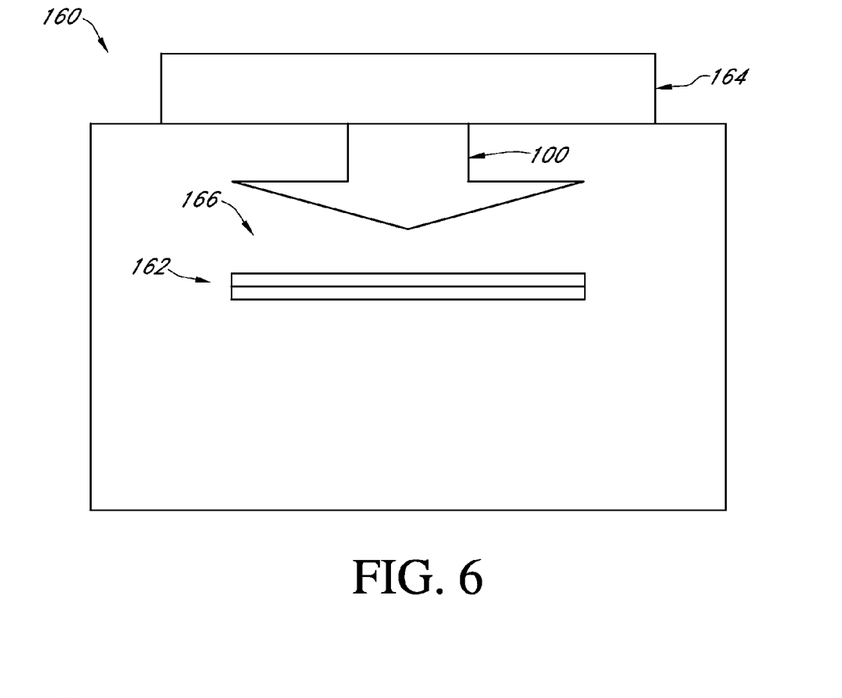
FIG. 6 shows one embodiment of a microwave bonding apparatus that defines a microwave cavity that facilitates exposure of the substrates to be bonded to the microwave energy.

FIG. 6 shows one embodiment of a bonding apparatus 160 that is configured to provide the microwave energy 100 to a substrate assembly 162 being bonded. The substrate assembly 162 may be any of the substrate-interlay-substrate configuration described herein.

In one embodiment, the bonding apparatus 160 defines a cavity 166 in which the substrate assembly 162 can be placed. The microwave energy 100 is provided to the substrate assembly 162 in the cavity 166 from a microwave generator 164. The microwave energy 100 may be transferred in a known manner, either directly or via a transfer assembly such as a waveguide.

Figure 7:
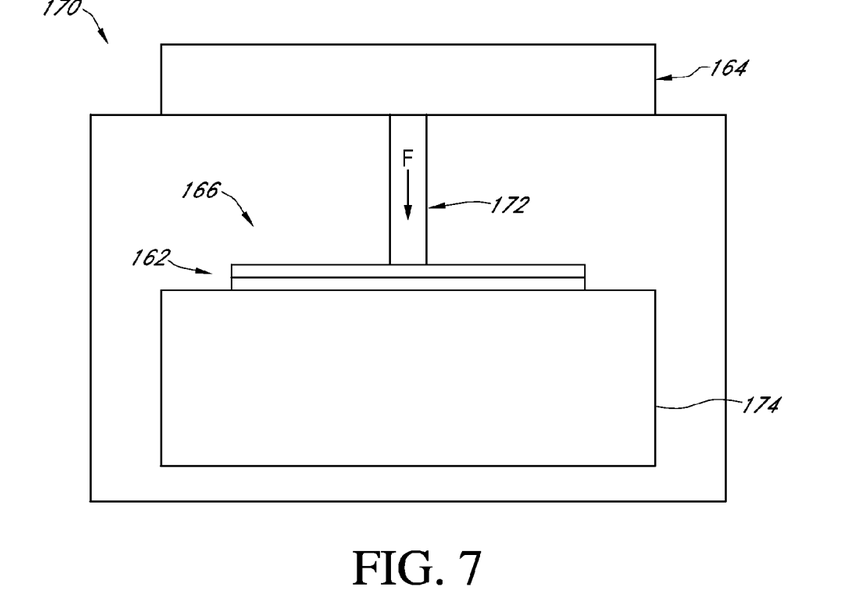
FIG. 7 shows that in one embodiment, a support platform can be disposed in the microwave cavity to support the substrates during the bonding process, and also a pressure applicator that provides parts intimacy to the substrates being bonded.

FIG. 7 shows that in one embodiment, the bonding apparatus 170 can include a platform 174 on which the substrate assembly 162 can be placed for the bonding process. The bonding apparatus 170 can also include a pressure applicator 172 that facilitates parts intimacy for the substrate assembly 162. In one embodiment, the pressure applicator 172 provides a force 172 along a direction having a component that is perpendicular to a plane defined by one or more substrates of the substrate assembly 162.

In one embodiment, the platform 174 is formed from an insulator material such as quartz, so as to reduce heat dissipation to the cavity. In one embodiment, the pressure applicator 172 is formed from a low microwave absorbing material such as quartz, so as to allow application of the parts intimacy pressure while reducing the disruption of the microwave energy being applied.

Figure 8:
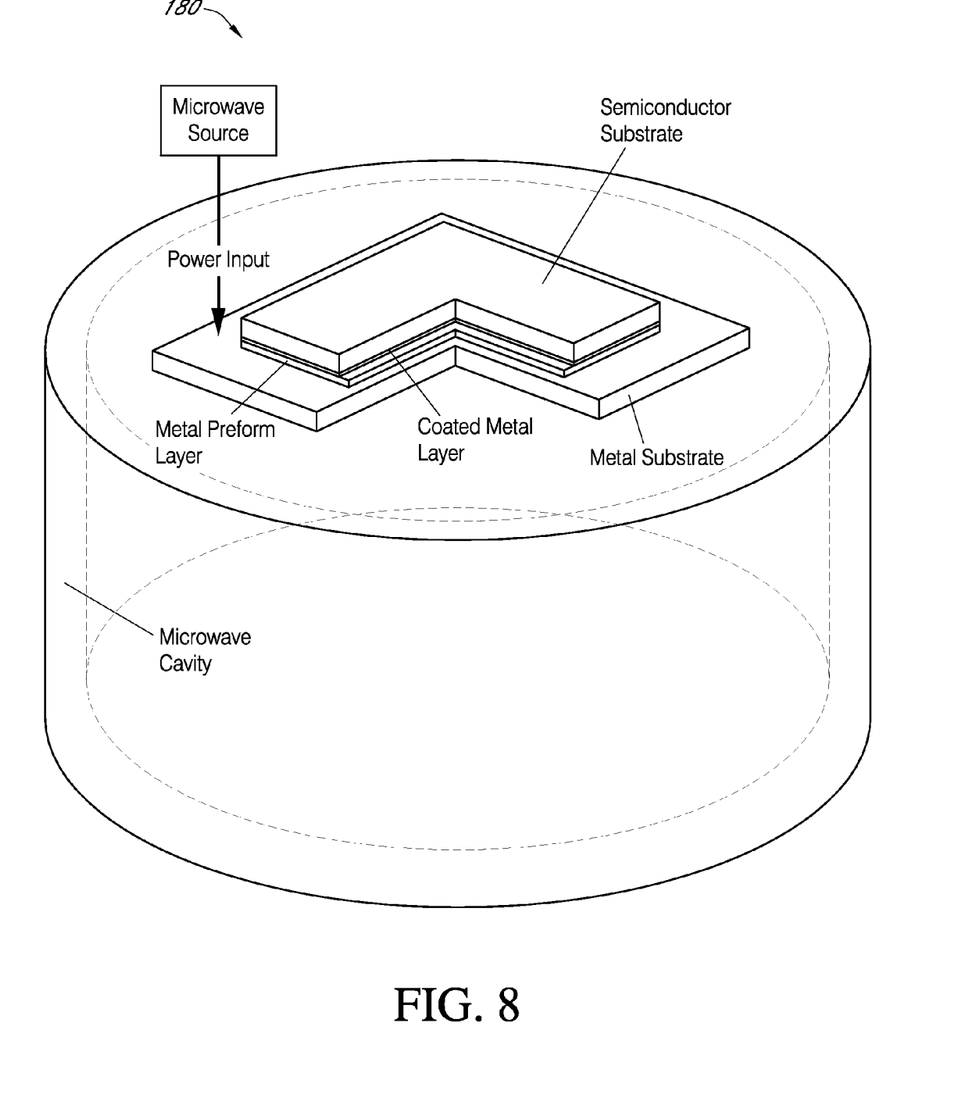
FIG. 8 shows that in one embodiment, the microwave cavity can be a cylindrical cavity that facilitates application of a substantially azimuthally symmetric microwave energy to the substrates.

In various embodiments, the microwave cavity 166 and the microwave energy 100 provided thereto can be implemented using known techniques. FIG. 8 shows that in one embodiment, the microwave cavity is a cylindrical cavity 180. An example substrate assembly is shown to be subjected to microwave energy from a microwave source.

In one embodiment, microwave radiation in a substantially single-mode condition is introduced into the cavity. In one embodiment, the example cylindrical cavity 180 of FIG. 8 can have a diameter of approximately 12.7 cm, and can be excited by a substantially azimuthally symmetric $TM_{010}$ mode signal at a frequency of about 2.2 GHz. The loaded Q value of the empty cavity may be approximately 2500.

Preferably, the substrate assembly is placed at an area of the cavity so that perturbation of a selected mode of the microwave in the cavity is kept to a minimum. In one embodiment, the selected mode is a normal mode within the cavity, and such mode is preferably perturbed as little as possible.

In one bonding application, a silicon wafer (example second substrate) having a dimension of approximately 40×40 $mm^2$ can be bonded to a larger sized copper (example first substrate). It is contemplated, however, that wafers smaller and larger than the foregoing example can be bonded. For example, wafers having dimensions between ¼ inch and 4 inches can be bonded. It will be understood, however, that the sizes of the wafers do not limit the implementation of the various techniques of the present disclosure.

In some embodiments, microwave energy can be applied to the substrate assembly in the cavity using one of a number of power-time profiles. Some of these profiles can have relatively high power delivered during relatively short times, while some profiles use the opposite. Different time-power profiles can be used with different materials and sizes of the substrates and/or the interlayer, and/or the position of such assembly in the cavity.

Figure 9:
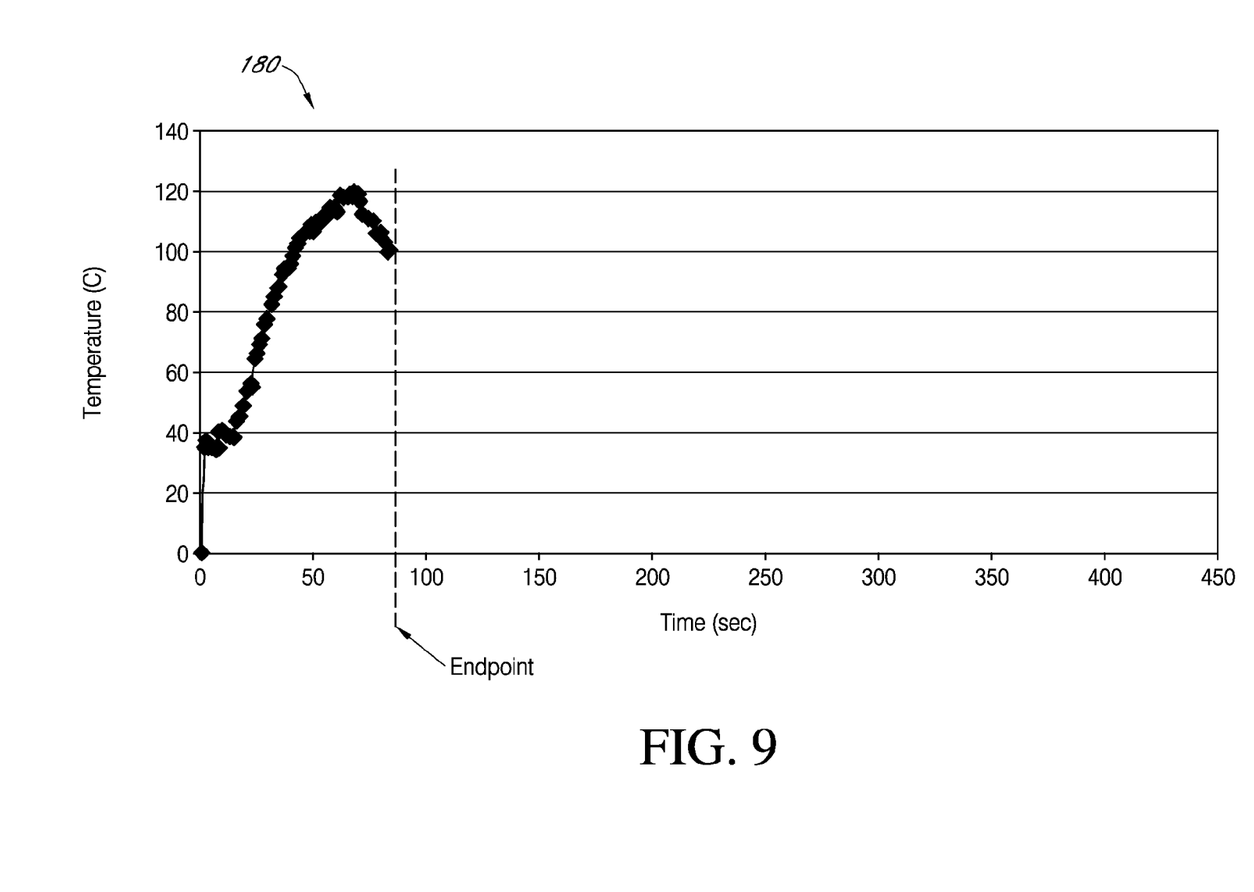
FIG. 9 shows an example power-time profile in terms of a temperature parameter associated with an example semiconductor substrate.

In an example power profile that can be applied to the example setup of FIG. 8, approximately 100 watts of microwave power is applied for approximately 40-60 seconds. FIG. 9 shows an example profile 190 of temperature associated with the semiconductor substrate (an example second substrate). In FIG. 9, an endpoint is indicated. One embodiment of endpoint determination is described below in greater detail.

In another example profile, approximately 90 watts of microwave power can be applied for approximately 2-3 minutes to achieve a gradient heating and cooling profile.

As described above, a pressure applicator can be used to provide parts intimacy for the substrate assembly. In some embodiments, a force applied by the pressure applicator can be measured and monitored. With such monitoring, the melting of a bonding material between the two substrates can be detected. For example, when the bonding material melts, that region gives in to the applied pressure, and the measured force undergoes a relatively sudden reduction.

Figure 10:
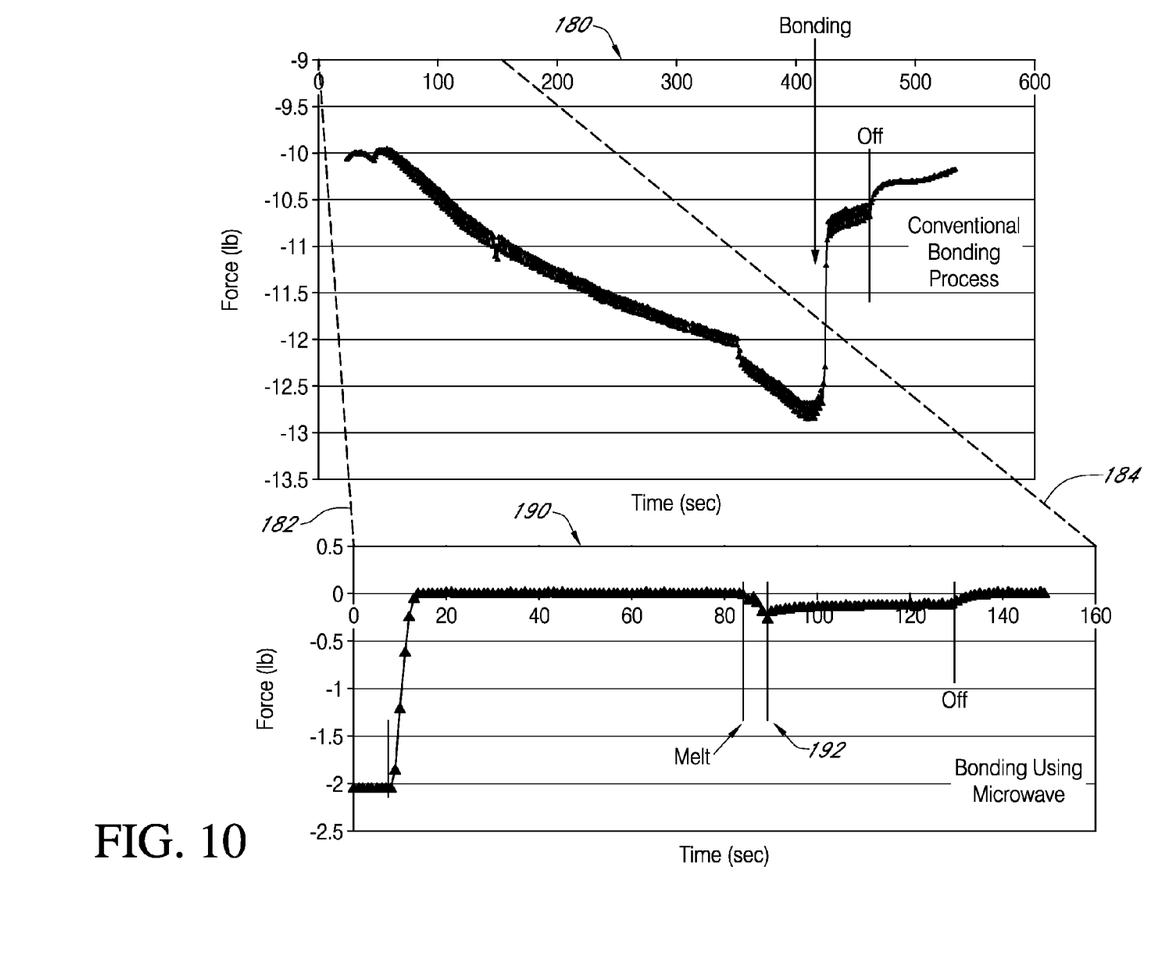
FIG. 10 shows a comparison of an example conventional bonding process with an example bonding process of one embodiment of the present disclosure.

FIG. 10 shows example force plots for an example conventional bonding process 180 and an example bonding process 190 using the microwave technique of the present disclosure (using AuSn as an interlayer). The vertical scales (force) are generally similar for the two plots. Time scales are different. Thus, to indicate similar duration, dashed lines 182 and 184 show corresponding times of approximately 0 and 160 seconds.

Comparison of the plots 180 and 190 show several noticeable differences. For example, the bonding in the conventional process occurs, as indicated, at time greater than 400 seconds. In contrast, the bonding can occur after the melting at time of approximately 83 seconds (indicated as "Melt" in the plot 190). In this example comparison, the technique using microwave can achieve bonding at approximately fifth of the time required to bond using the example conventional process.

As also shown in FIG. 10, the example conventional bonding can result in the monitored force to steadily increase as energy is applied to the bonding substrates. Applicant believes that such increase in the monitored force is due to the thermal expansion of the substrates as the substrates heat up.

In contrast, in the process 190, once the parts-intimacy force is applied to the substrates, that force stays generally constant, until the melt occurs. Applicant believes that such generally-constant monitored force indicates that the substrates are not being thermally expanded significantly. Note that in the conventional case, the gradual increase in the force is present in the similar time range preceding the time of approximately 83 seconds (which corresponds to the melt time of approximately 83 seconds in the process 190).

In the example process 190, the force is shown to be "recovering" from the decline at a time indicated by a reference numeral 192. This recovery in the force can be explained, because pressure was added to compensate for the height collapse of the substrate assembly due to the melted interlayer.

Based on the foregoing example, one can see that the techniques of the present disclosure can provide a faster bonding of substrates without significant thermal expansion (and the corresponding effects). Furthermore, monitoring of the applied force to the substrate assembly can lead to detection of the melting of the interlayer. The application of the microwave can then be either terminated or phased out in some manner.

Figure 11:
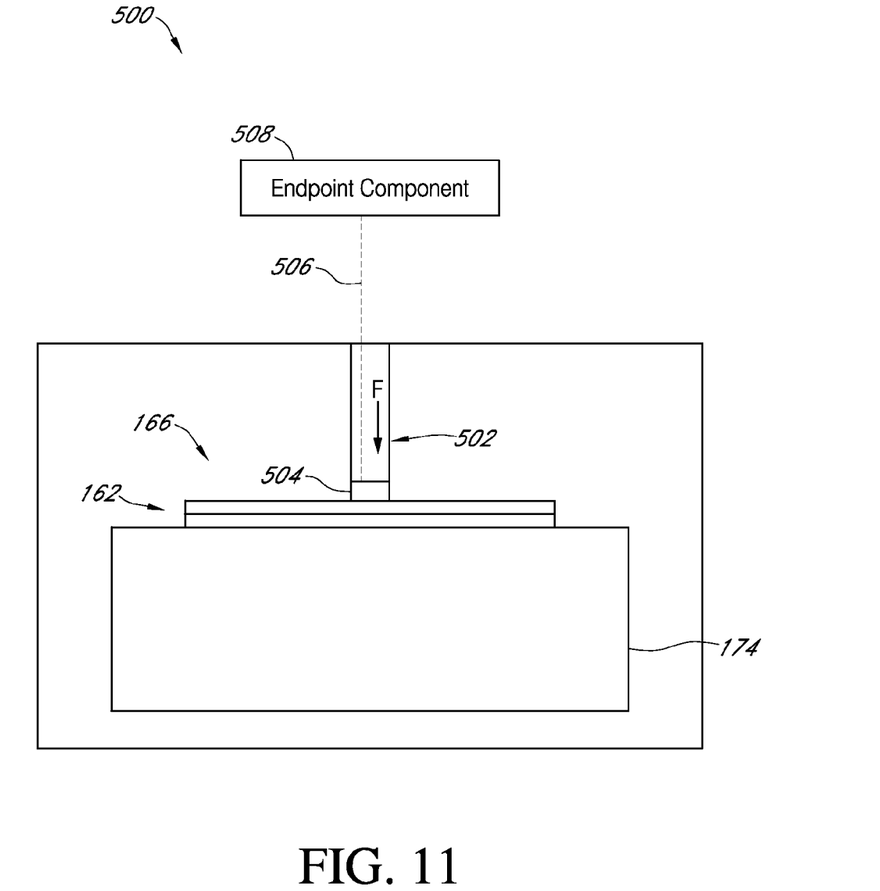
FIG. 11 shows that in one embodiment, the microwave bonding apparatus can include an endpoint component that can determine when melting of the interlayer occurs.

FIG. 11 shows that in one embodiment, a microwave bonding apparatus can include a pressure applicator 502 that includes a pressure sensor 504 such as a pressure transducer. Measurements obtained from the sensor 504 can provide information about the force applied to the substrate assembly 162.

In one embodiment, the pressure sensor 504 is shown to be linked (indicated by a dotted line 506) to an endpoint component 508 that is configured to monitor and determine when melting occurs. The endpoint component 508 can output an appropriate signal to end the bonding process.

In some embodiments, other pressure sensors can be distributed various areas on top of the substrate assembly. For example, a pressure applicator can include a suction device engaged to the top substrate (second substrate) to provide positioning and parts intimacy. The suction device can have a plurality of pressure transducers disposed at various locations to provide force measurements from those locations. Such measurements can be used to monitor and adjust (if necessary) the orientation of the top substrate relative to some reference by applying more or less force at those locations.

Although the above-disclosed embodiments have shown, described, and pointed out the fundamental novel features of the invention as applied to the above-disclosed embodiments, it should be understood that various omissions, substitutions, and changes in the form of the detail of the devices, systems, and/or methods shown may be made by those skilled in the art without departing from the scope of the invention. Consequently, the scope of the invention should not be limited to the foregoing description, but should be defined by the claims of one or more applications that follow this application.

What is claimed is:

1. A method for bonding substrates, comprising:
providing a first substrate and a second substrate, at least one of the first and second substrates comprising a semiconductor substrate having an integrated circuit;
providing an interlayer between the first substrate and the second substrate;
providing microwave energy so that at least a portion of the microwave energy is absorbed by the interlayer to thereby raise the temperature of the interlayer, wherein the temperature of the interlayer increases faster than that of the first and second substrates and melts to thereby facilitate bonding of the first and second substrates;
wherein the interlayer is initially separate from and not attached to the first and second substrates prior to the providing of microwave energy, the interlayer comprising a metal layer having a heat capacity less than that of the first and second substrates, the metal layer comprising a thin-film metal layer.

2. The method of claim 1, wherein the first substrate comprises a metal substrate and the second substrate comprises the semiconductor substrate, the first and second substrates oriented so that the microwave energy impinges on the second substrate first.

3. The method of claim 1, wherein the semiconductor substrate is in a wafer form.

4. The method of claim 1, wherein the first substrate is formed from a first semiconductor.

5. The method of claim 1, further comprising providing a force that facilitates parts intimacy for the first and second substrates with the interlayer therebetween.

6. The method of claim 4, wherein the second substrate is formed from a second semiconductor.

7. The method of claim 5, further comprising monitoring the force so as to allow detection of a melt point of the interlayer.

* * * * *